(12) United States Patent
Zhang et al.

(10) Patent No.: US 11,948,832 B2
(45) Date of Patent: Apr. 2, 2024

(54) BOTTOM IMPLANT AND AIRGAP ISOLATION FOR NANOSHEET SEMICONDUCTOR DEVICES

(71) Applicant: Applied Materials, Inc., Santa Clara, CA (US)

(72) Inventors: Yan Zhang, Westford, MA (US); Johannes M. van Meer, Middleton, MA (US); Naushad K. Variam, Marblehead, MA (US)

(73) Assignee: Applied Materials, Inc., Santa Clara, CA (US)

( * ) Notice: Subject to any disclaimer, the term of this patent is extended or adjusted under 35 U.S.C. 154(b) by 298 days.

(21) Appl. No.: 17/480,482

(22) Filed: Sep. 21, 2021

(65) Prior Publication Data

US 2023/0089482 A1 Mar. 23, 2023

(51) Int. Cl.
*H01L 21/764* (2006.01)
*H01L 21/8238* (2006.01)
*H01L 27/092* (2006.01)

(52) U.S. Cl.
CPC .... *H01L 21/764* (2013.01); *H01L 21/823878* (2013.01); *H01L 27/092* (2013.01)

(58) Field of Classification Search
CPC .......... H01L 21/764; H01L 21/823878; H01L 27/092; H01L 29/66439; H01L 29/775; H01L 29/78696
See application file for complete search history.

(56) References Cited

U.S. PATENT DOCUMENTS

| | | | |
|---|---|---|---|
| 2004/0147093 A1* | 7/2004 | Marty | H01L 21/764 257/E21.549 |
| 2021/0328013 A1* | 10/2021 | Ando | H01L 29/66545 |
| 2023/0095140 A1* | 3/2023 | Xie | H01L 27/088 257/288 |

* cited by examiner

*Primary Examiner* — Karen Kusumakar
*Assistant Examiner* — Adam S Bowen
(74) *Attorney, Agent, or Firm* — KDW Firm PLLC

(57) ABSTRACT

A semiconductor manufacturing process and semiconductor device having an airgap to isolate bottom implant portions of a substrate from upper source and drain device structure to reduce bottom current leakage and parasitic capacitance with an improved scalability on n-to-p spacing scaling. The disclosed device can be implanted to fabricate nanosheet FET and other such semiconductor device. The airgap is formed by etching into the substrate, below a trench in a vertical and horizontal direction. The trench is then filled with dielectric and upper device structure formed on either side of the dielectric filler trench.

19 Claims, 13 Drawing Sheets

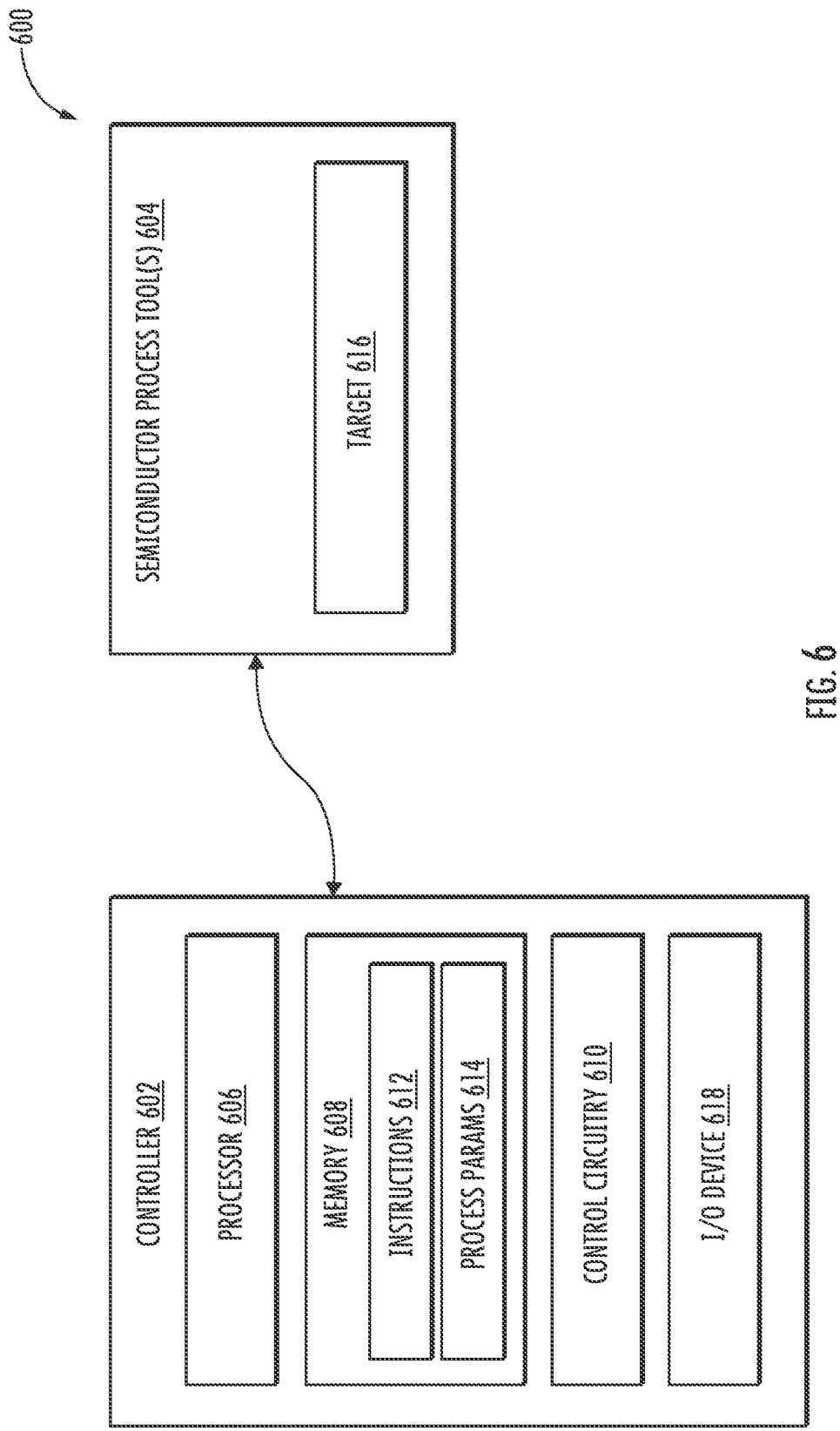

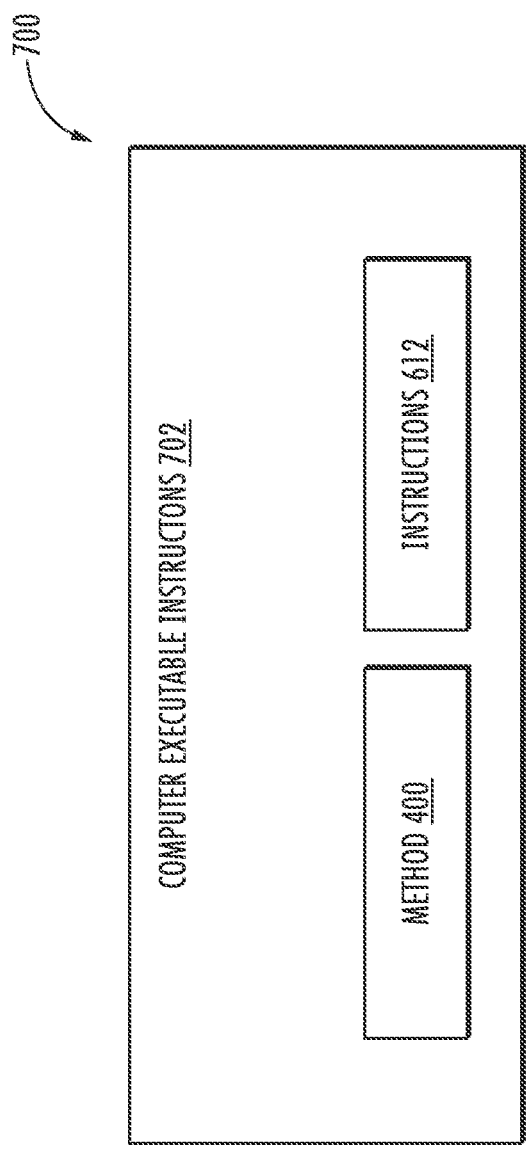

BOTTOM IMPLANT AND AIRGAP ISOLATION FOR NANOSHEET SEMICONDUCTOR DEVICES

FIELD OF THE DISCLOSURE

The present description, example embodiments, and claims relate to semiconductor devices and particularly to blocking bottom parasitic channel leakage paths in nanosheet field effect transistor (FET) devices.

BACKGROUND OF THE DISCLOSURE

FIG. 1 illustrates a nanosheet field effect transistor (FET) device 100. In general, nanosheet FET device 100, also referred to as a nanowire or stacked nanosheet device, comprises a device channel 102 which itself comprises one or more nanosheet layers 104 in a stacked configuration. Nanosheet devices are often defined where each nanosheet layer 104 has a vertical thickness that is substantially less than the width of the nanosheet layer. A common gate structure is formed above and below each nanosheet layer 104 in the device channel 102, thereby increasing the nanosheet FET device 100 width (or channel width), and thus the drive current, for a given footprint area.

One challenge in fabricating nanosheet FET devices (e.g., nanosheet FET device 100) is the ability to effectively isolate the nanosheet FET devices from an underlying semiconductor substrate 106. For example, depending on the FET structure, a parasitic transistor channel is formed in the semiconductor substrate 106 below a bottom of the stacked nanosheet structure (e.g., device channel 102), thereby resulting in unwanted leakage current 108 and parasitic capacitance (not shown).

To reduce leakage current due to the parasitic transistor channel, ion implantations are conventionally utilized to form an isolation region in the substrate. For example, Boron implants to form a positive isolation well (PW) for nFET, and Phosphorus implants to form a negative isolation well (NW) for pFET. However, with continuous pitch scaling, the leakage current from the parasitic channel with this approach is very difficult to meet the requirement. Additionally, parasitic capacitance between the gate and the heavily doped semiconductor substrate is often increased. Most importantly, with the continuous scaling on the spacing between nFET and pFET, misalignment due to patterning for PW, NW and n-to-p dielectric wall formation could generate a short path between source and drain as depicted in FIG. 2, which depicts a source to drain (S-D) short 202 of a nanosheet device 200.

Another approach to reduce leakage current due to the parasitic transistor channel is to isolate the bottom of the stacked nanosheet structure with dielectric. This approach adds numerous process steps as well as cost to the manufacturing. Additionally, there is a requirement for increased selectivity in the etch and oxidation process steps as well as a higher quality dielectric than otherwise might be used. Lastly, this approach is prone to source and drain epitaxial defects due to the existence of the dielectric layer.

Accordingly, there is a need for an improved, low-cost process and/or structure for reducing leakage current and parasitic capacitance in the bottom parasitic channel of nanosheet FET devices with good scalability on n-to-p spacing scaling.

BRIEF SUMMARY

Brief Description of the Several Views of the Drawings

To easily identify the discussion of any particular element or act, the most significant digit or digits in a reference number refer to the figure number in which that element is first introduced. Furthermore, like numbering represents like elements.

The drawings are merely representations, not intended to portray specific parameters of the disclosure and are not necessarily to scale. The drawings are intended to depict exemplary embodiments of the disclosure, and therefore are not be considered as limiting in scope.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

Figure 1:
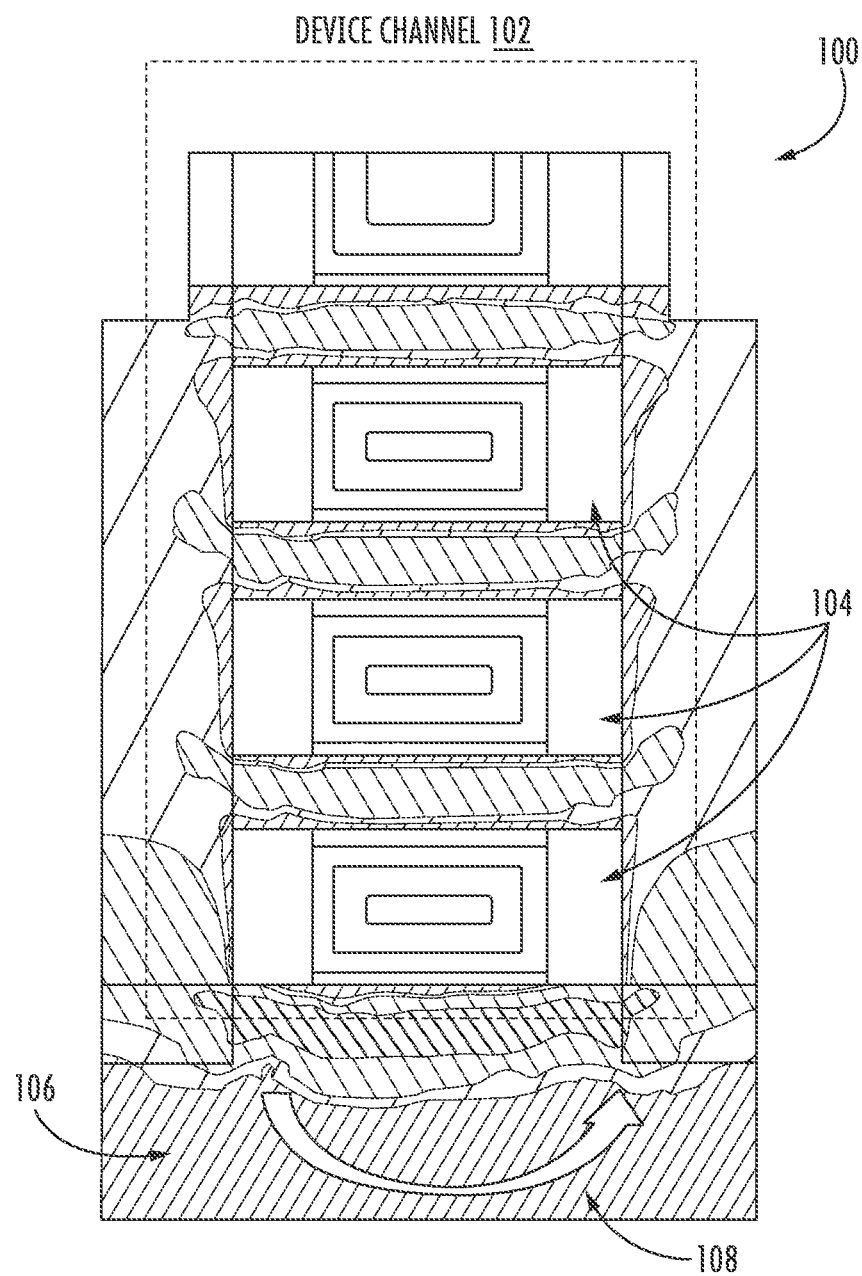

FIG. 1 illustrates a nanosheet FET device 100 having a leakage current 108 path.

Figure 2:
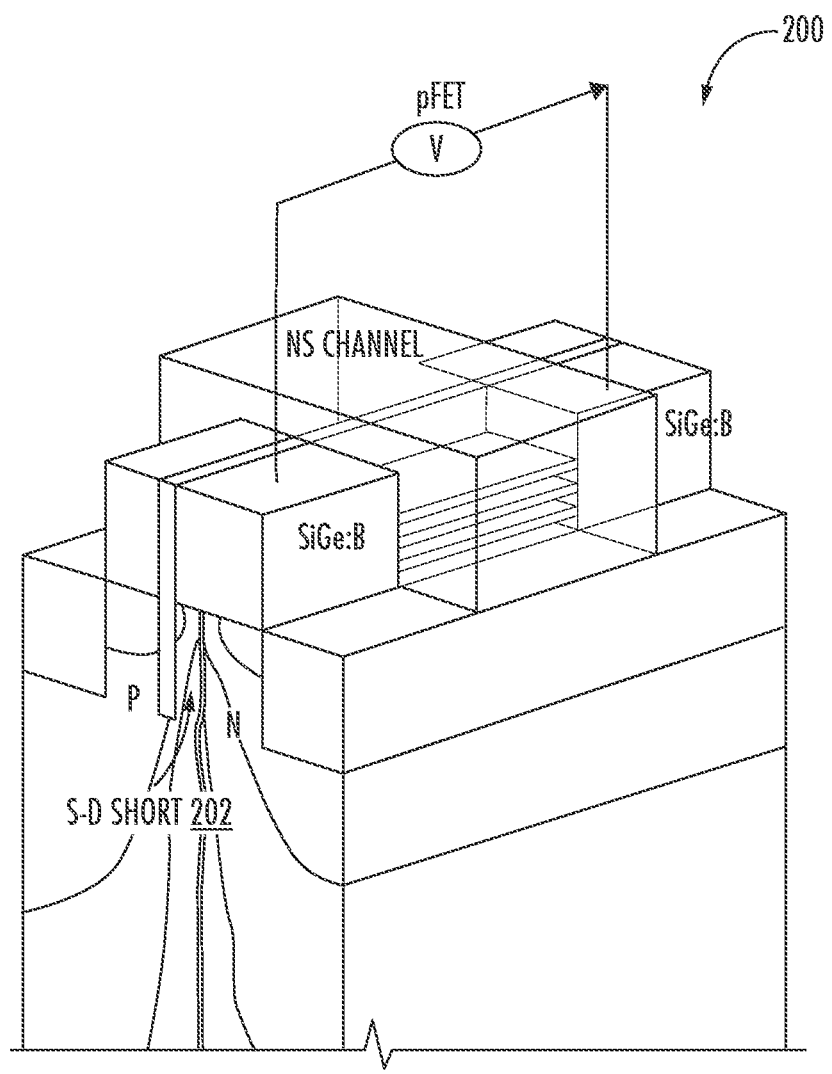

FIG. 2 illustrates a nanosheet device 200 having an S-D short 202.

Figure 3:
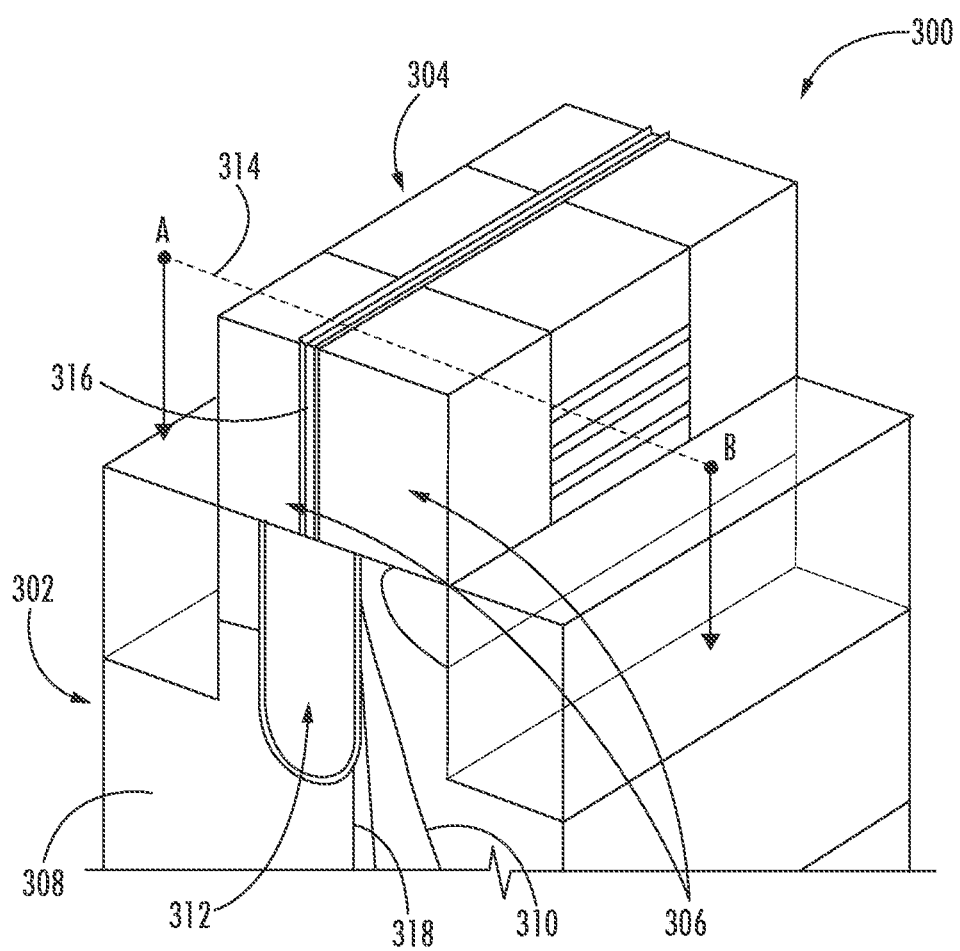

FIG. 3 illustrates a FET device 300 having an airgap 312 to block a bottom current leakage path, in accordance with at least one embodiment of the present disclosure.

Figure 4:
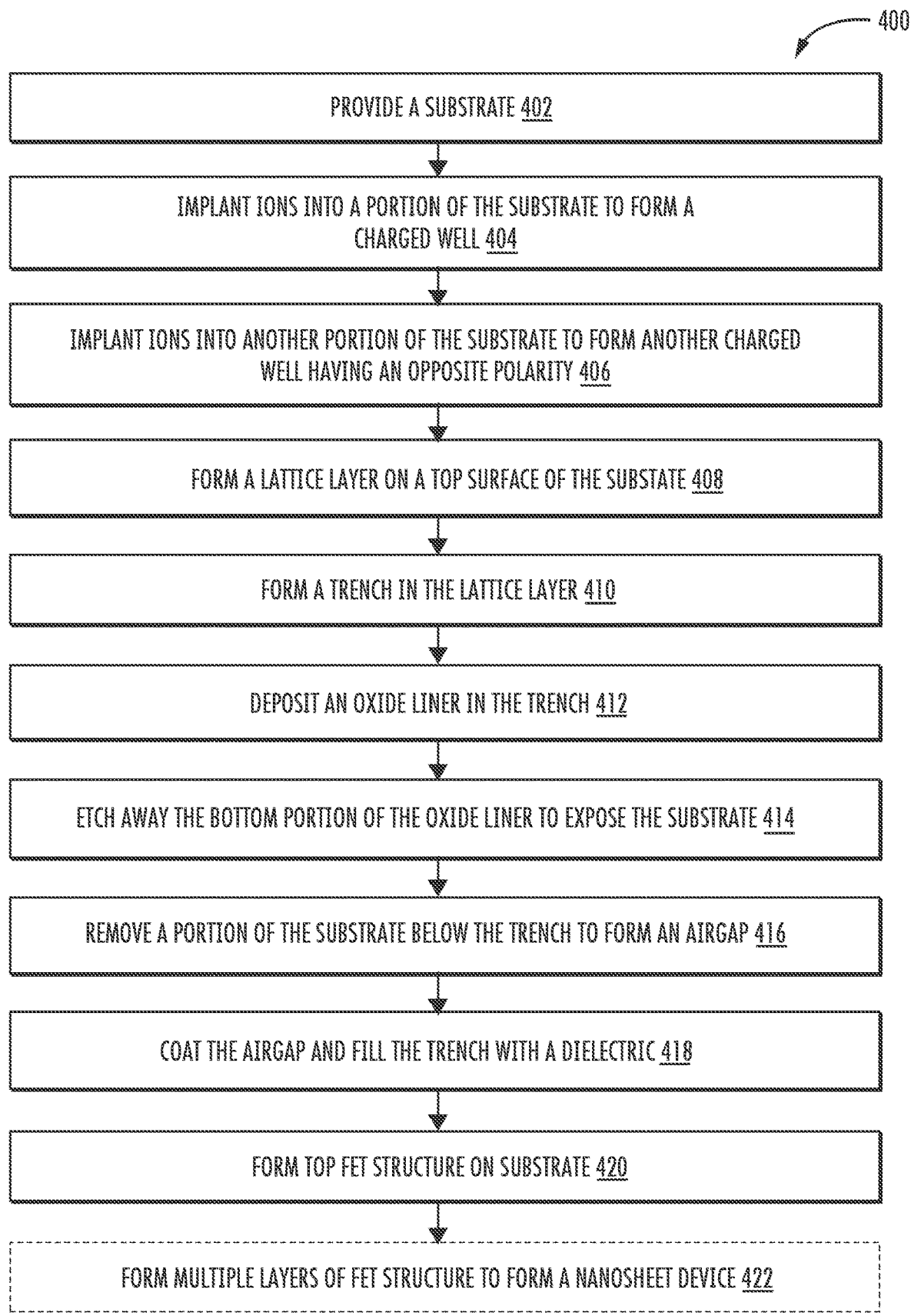

FIG. 4 illustrates a method 400 for manufacturing FET device 300, in accordance with at least one embodiment of the present disclosure.

Figure 5A:
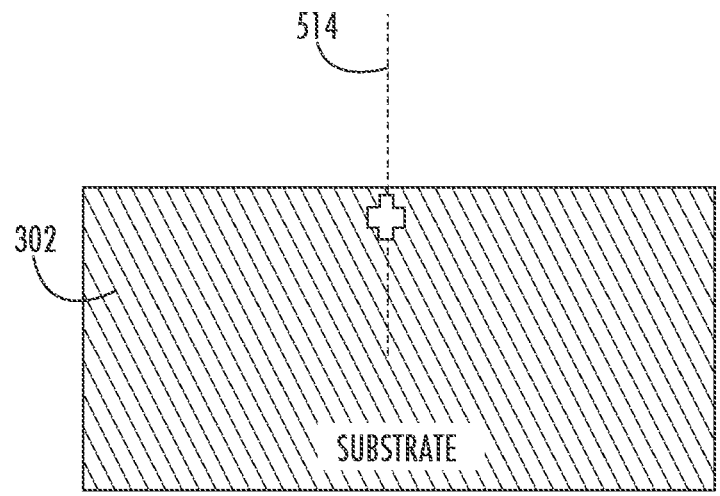

FIG. 5A illustrates FET device 300 during a stage of manufacture, in accordance with at least one embodiment of the present disclosure.

Figure 5B:
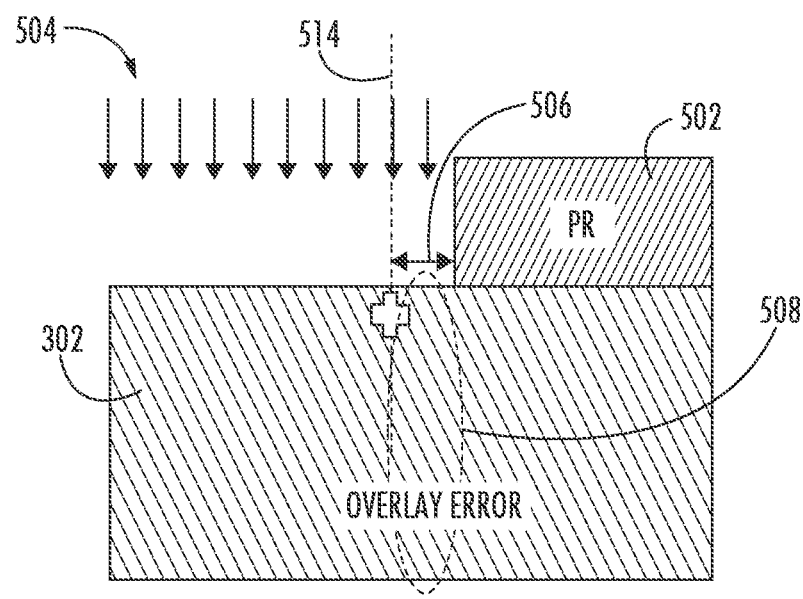

FIG. 5B illustrates FET device 300 during a stage of manufacture, in accordance with at least one embodiment of the present disclosure.

Figure 5C:
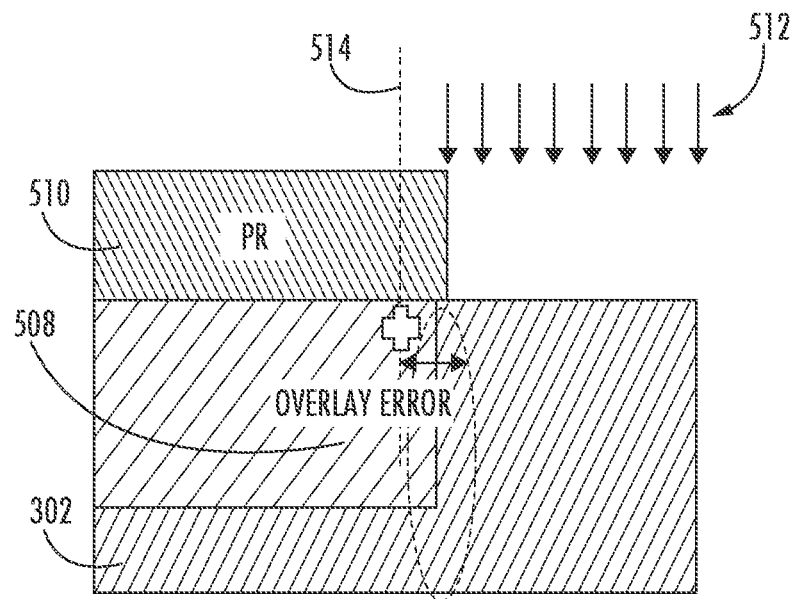

FIG. 5C illustrates FET device 300 during a stage of manufacture, in accordance with at least one embodiment of the present disclosure.

Figure 5D:
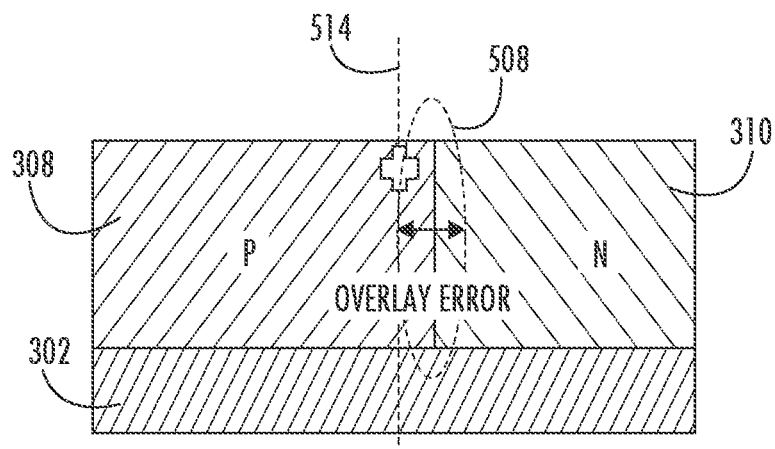

FIG. 5D illustrates FET device 300 during a stage of manufacture, in accordance with at least one embodiment of the present disclosure.

Figure 5E:
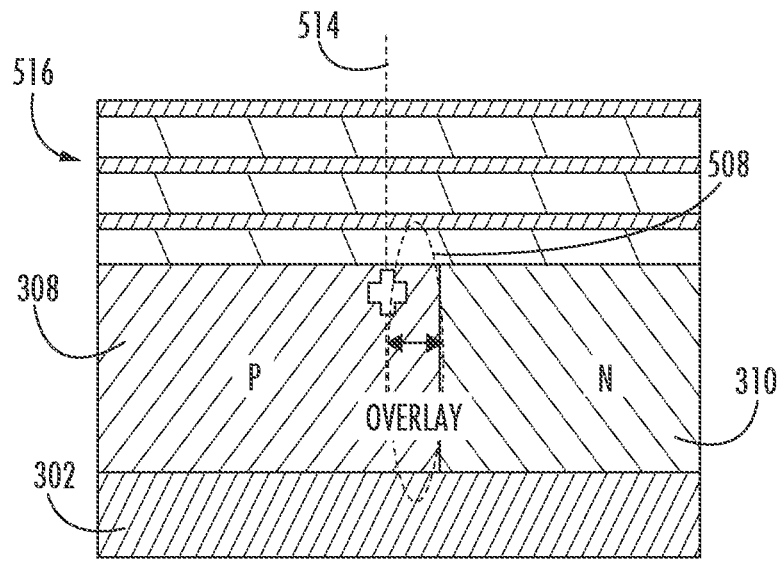

FIG. 5E illustrates FET device 300 during a stage of manufacture, in accordance with at least one embodiment of the present disclosure.

Figure 5F:
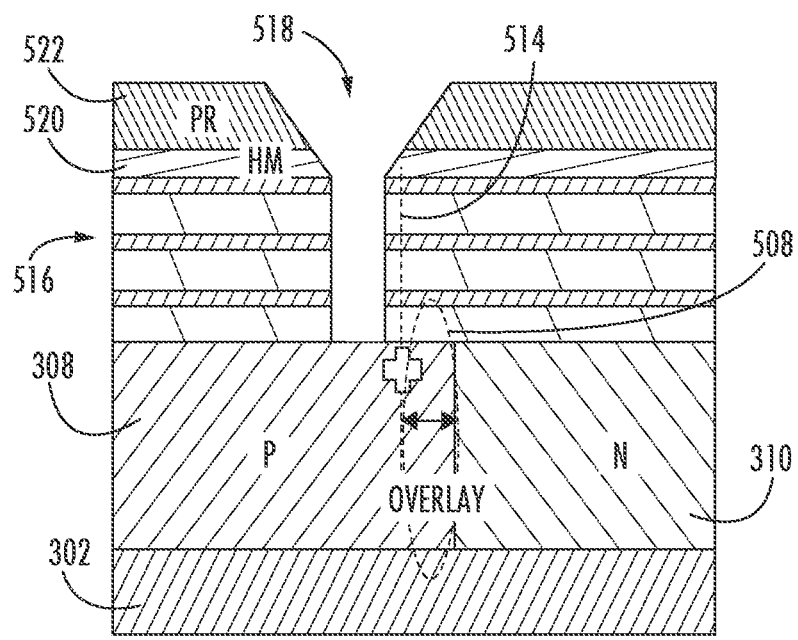

FIG. 5F illustrates FET device 300 during a stage of manufacture, in accordance with at least one embodiment of the present disclosure.

Figure 5G:
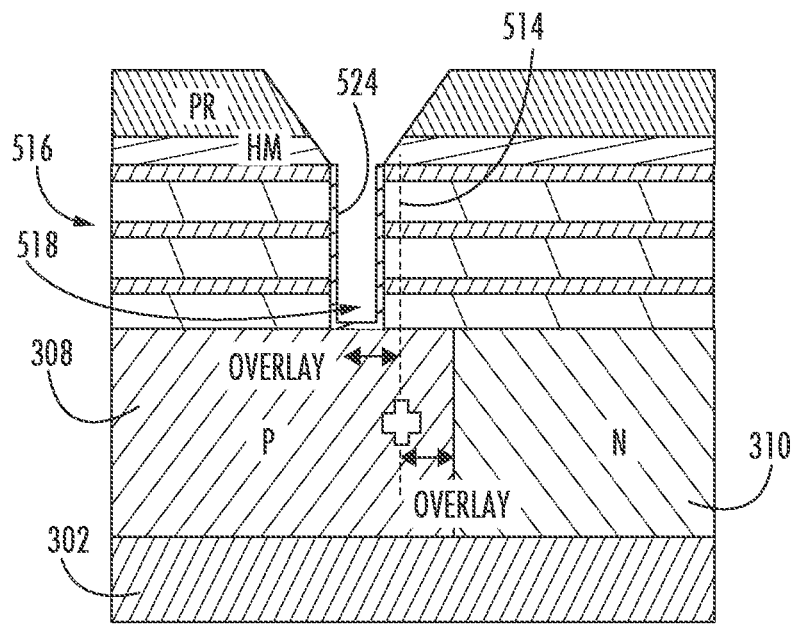

FIG. 5G illustrates FET device 300 during a stage of manufacture, in accordance with at least one embodiment of the present disclosure.

Figure 5H:
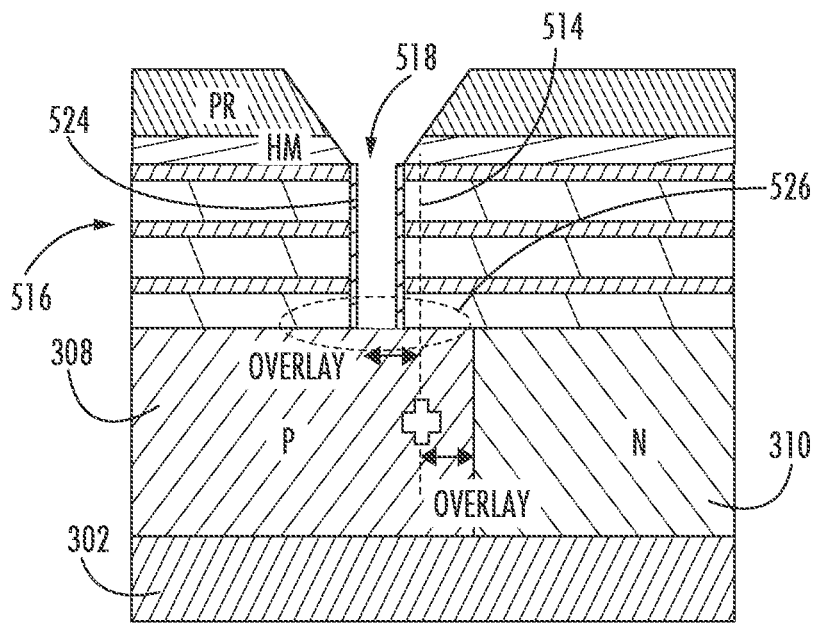

FIG. 5H illustrates FET device 300 during a stage of manufacture, in accordance with at least one embodiment of the present disclosure.

Figure 5I:
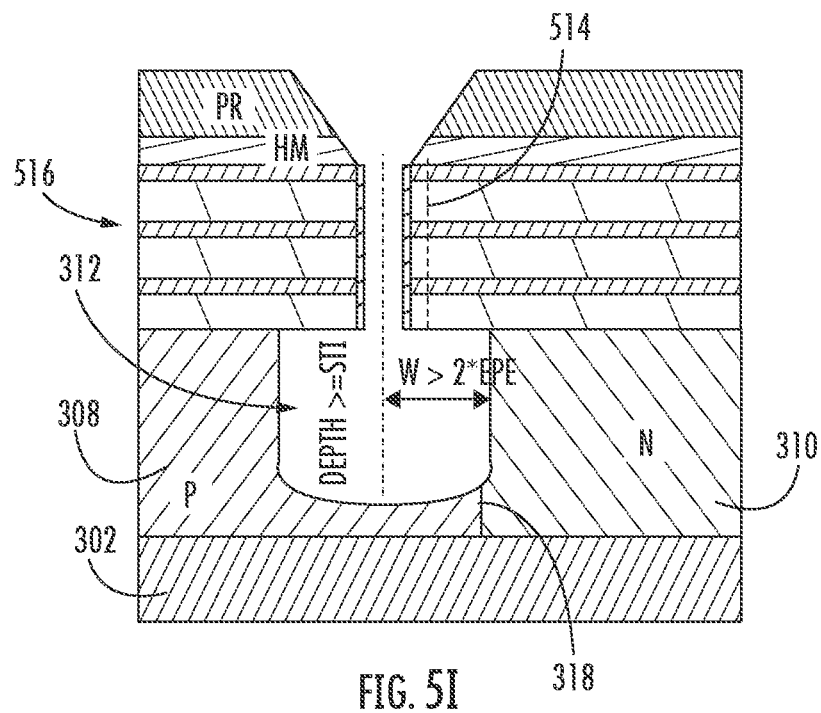

FIG. 5I illustrates FET device 300 during a stage of manufacture, in accordance with at least one embodiment of the present disclosure.

Figure 5J:
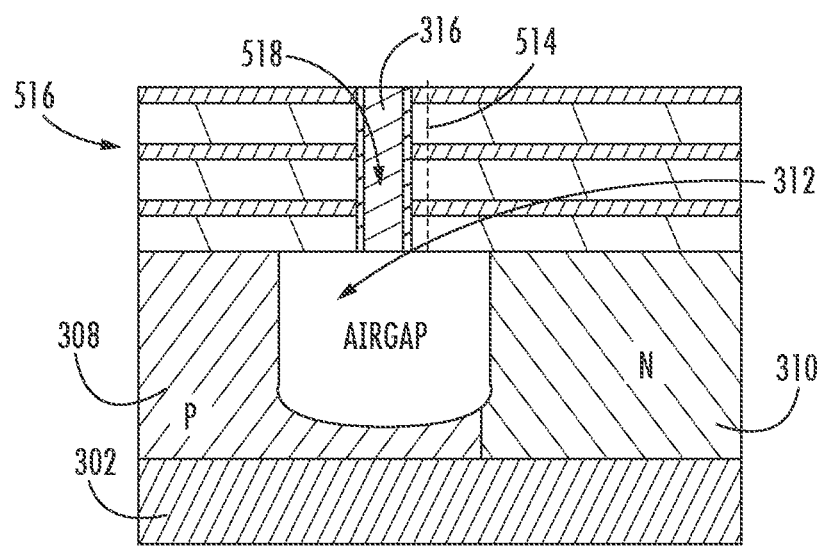

FIG. 5J illustrates FET device 300 during a stage of manufacture, in accordance with at least one embodiment of the present disclosure.

Figure 5K:
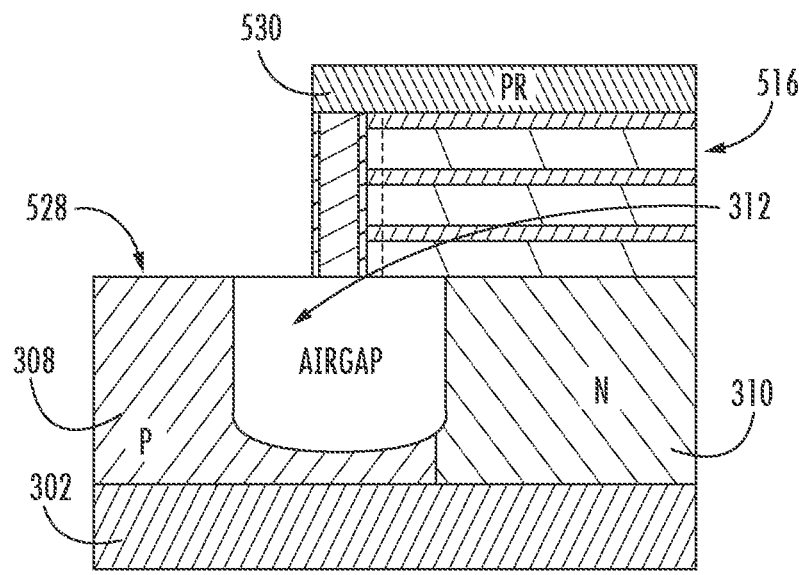

FIG. 5K illustrates FET device 300 during a stage of manufacture, in accordance with at least one embodiment of the present disclosure.

Figure 5L:
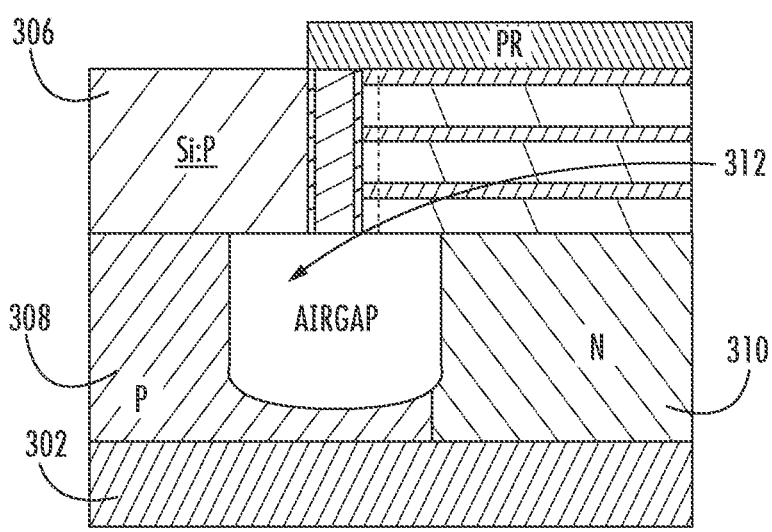

FIG. 5L illustrates FET device 300 during a stage of manufacture, in accordance with at least one embodiment of the present disclosure.

Figure 5M:
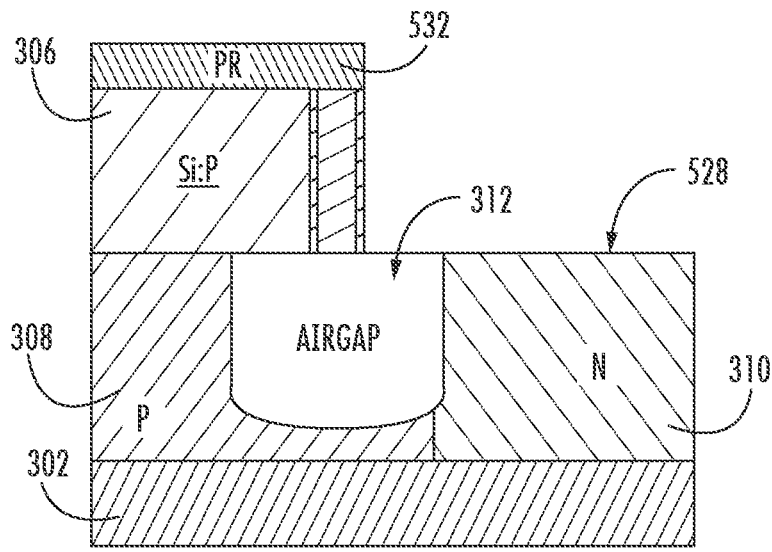

FIG. 5M illustrates FET device 300 during a stage of manufacture, in accordance with at least one embodiment of the present disclosure.

Figure 5N:
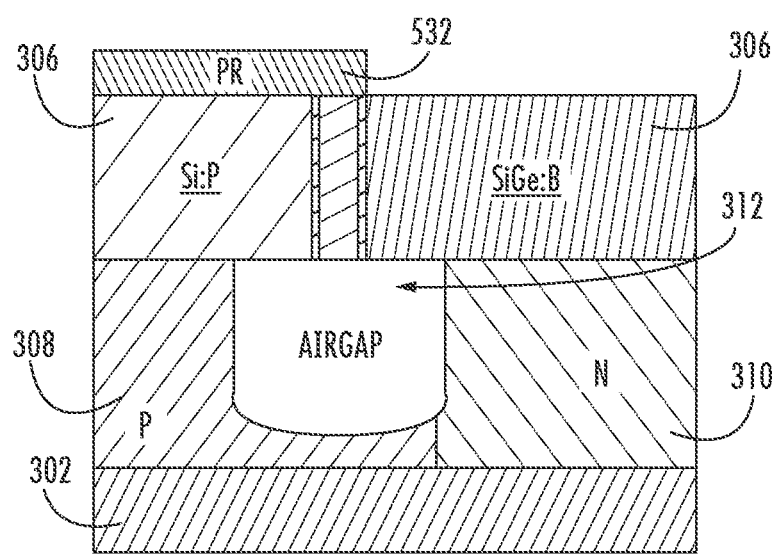

FIG. 5N illustrates FET device 300 during a stage of manufacture, in accordance with at least one embodiment of the present disclosure.

FIG. 6 illustrates a semiconductor manufacturing system 600, in accordance with at least one embodiment of the present disclosure.

FIG. 7 illustrates a computer-readable storage medium 700 in accordance with at least one embodiment of the present disclosure.

DETAILED DESCRIPTION

Methods, devices, and systems in accordance with the present disclosure will now be described more fully hereinafter with reference to the accompanying drawings, where various embodiments are shown. The methods, devices, and systems may be embodied in many different forms and are not to be construed as being limited to the embodiments set forth herein. Instead, these embodiments are provided so the disclosure will be thorough and complete, and will fully convey the scope of the described methods and devices to those skilled in the art.

As mentioned above, there is a need for an improved process and/or structure that reduces leakage current and capacitance in the bottom parasitic channel of nanosheet FET devices. Embodiments of the present disclosure provide a bottom implant and airgap isolation structure that blocks the bottom parasitic current leakage channel. Further, the present disclosure provides advantages over prior art attempts at a solution as the present disclosure has better scalability, reduced integration challenges, and reduced cost.

FIG. 3 illustrates a FET device 300, in accordance with non-limiting embodiment(s) of the present disclosure. FET device 300 includes top structure 304 formed on a substrate 302. Top structure 304 includes source and drain regions 306 (e.g., upper semiconductor device structure) while substrate 302 includes a positively doped region and a negatively doped region, depicted as P area 308 and N area 310. The source and drain regions 306 of top structure 304 are separated by a dielectric 316 while a demarcation or separation between the doped regions (e.g., P area 308 and N area 310) is depicted with doped region barrier 318.

FET device 300 additionally, includes an airgap 312 formed in substrate 302. Airgap 312 is formed under dielectric 316 and extends out to doped region barrier 318. Airgap 312 blocks leakage current paths between different sides of the source and drain regions 306 through substrate 302. FET device 300 can form the base layer for a nanosheet FET device, such as that depicted in FIG. 1. That is, further layers of FET device structure (e.g., source and drain regions 306, etc.) can be formed on top structure 304 to form a nanosheet FET device.

FET device 300 and an illustrative process (FIG. 4) for forming the FET device 300 provide advantageous as they overcome the patterning and lithography constraints that limit prior attempts at reducing leakage current in the bottom parasitic channel of FET devices (e.g., nanosheet FET device 100, or the like).

FIG. 4 illustrates a method 400 for forming a nanosheet FET with an airgap, in accordance with non-limiting embodiment(s) of the present disclosure. More specifically, method 400 can be used to form airgap 312 in a substrate 302. It is noted that method 400 is described with reference to the cross-sectional views depicted in FIG. 5A to FIG. 5N for ease of explanation and visual description of the process steps described with reference to method 400. FIG. 5A to FIG. 5N depict cross-sectional views of a semiconductor device at various stages of manufacturing and can correspond to a cross-sectional view of FET device 300 at cutaway line 314. It is noted that method 400 could be implemented to form a device having different structure or configuration (e.g., gate structures, doping, material selection, or the like) than shown in FIG. 5A to FIG. 5N and described herein and the claims are not limited in this respect. Furthermore, method 400 can be used in a manufacturing process to form a nanosheet FET devices having any number of layers.

Method 400 can begin at block 402. At block 402 "provide a substrate" a substrate can be provided as part of method 400 for manufacturing a FET device (e.g., FET device 300, or the like). FIG. 5A depicts substrate 302 and further depicts a centerline 514 of substrate 302. Substrate 302 can be any of a variety of semiconductor substrates used in manufacturing semiconductor devices, such as silicon (Si), germanium (Ge), Si carbine (SiC), etc.).

Continuing to block 404 "implant ions into a portion of the substrate to form a charged well" ions are implanted into a portion of the substrate 302 to form a charged well. Block 404 can be implemented based on a variety of ion implant, or semiconductor doping processes. FIG. 5B depicts a photoresist (PR) mask 502 formed on, or disposed proximate to, substrate 302 to block or cover a portion of substrate 302. Ions 504 can be implanted into the exposed portion of substrate 302 in an implant process. For example, ions 504 can be implanted into the exposed portion of substrate 302 to positively charge that portion of the substrate.

A common error in implant processing and particularly, in forming photomasks (e.g., PR mask 502) is the misalignment between an edge of the PR mask 502 and the centerline 514 of the substrate 302. For example, FIG. 5B depicts PR mask 502 offset 506 a distance away from the substrate 302. As such, ions will be implanted into a region 508 of substrate 302 in which they should not be as the PR mask 502 is misaligned with the centerline 514 or the substrate 302, thereby resulting in an overlay error.

Continuing to block 406 "implant ions into another portion of the substrate to form a charged well having an opposite polarity" ions are implanted into another portion of the substrate 302 to form an oppositely charged well to the well formed at block 404. Like block 404, block 406 can be implemented based on a variety of ion implant, or doping, processes. FIG. 5C depicts PR mask 502 removed and a new PR mask 510 formed on, or disposed proximate to, substrate 302 to block or cover the portion of substrate 302 already subjected to doping at block 404. Ions 512 can be implanted into the exposed portion of substrate 302 in an implant process. For example, ions 512 can be implanted into the exposed portion of substrate 302 to negatively charge that portion of the substrate.

As depicted, the alignment error of block 404 shown in FIG. 5B is perpetuated at block 406, as depicted in FIG. 5C. That is the overlay error in region 508 remains. This is more clearly illustrated in FIG. 5D, which shows the substrate 302 having a positively (P) charged region forming P area 308 (e.g., resulting from block 404) and a negatively (N) charged region forming N area 310 (e.g., resulting from block 406). However, due to the misalignment of PR mask 502 and PR mask 510 discussed herein, P area 308 extends past the centerline 514 and into region 508. It is to be appreciated that such misalignment are one reasons why paths for leakage current (e.g., leakage current 108) are present in nanosheet FET devices. As will be described herein, method 400 provides airgap 312, which reduces or removes the effects of this misalignment and the extension of one well (e.g., P or N) into region 508 where the other well should be.

Method 400 continues at block 408 "form a lattice layer on a top surface of the substrate" a semiconductor lattice layer is formed on substrate 302. FIG. 5E depicts substrate 302 with P area 308 and N area 310. Additionally, lattice layer 516 is depicted grown (e.g., based on an epitaxial growth process, or the like) on a top surface of substrate 302. In some embodiments, lattice layer 516 can be a lattice of alternating S and SGe semiconductor layers.

Continuing to block 410 "form a trench in the lattice layer" a trench is formed in the lattice layer 516. Referring to FIG. 5F, trench 518 can be formed based on a photolithography etch process where hard mask (HM) 520 and/or PR mask 522 are disposed on lattice layer 516 and then a section of lattice layer 516 is removed down to the substrate 302. For example, an etch process with a hard stop at the substrate 302 can be applied to remove the portion of lattice layer 516 exposed by HM 520 and PR mask 522.

Continuing to block 412 "deposit an oxide liner in the trench" an oxide liner 524 is deposited in trench 518, or said differently, the trench 518 is coated with an oxide liner 524. Referring to FIG. 5G, oxide liner 524 can be deposited onto the bottom and sidewalls of trench 518.

Continuing to block 414 "etch away the bottom portion of the oxide liner to expose the substrate" the bottom portion of oxide liner 524 is removed, for example via a etch process. Referring to FIG. 5H, a bottom portion, or said differently, the portion of oxide liner 524 in area 526 adjacent to substrate 302 can be removed (e.g., via a dry etch process, or the like).

Continuing to block 416 "remove a portion of the substrate below the trench to form an airgap" material from the substrate 302 is removed to form airgap 312 in substrate 302, for example via an etch process. Referring to FIG. 5I, airgap 312 is formed with lateral or horizontal widths that extends away from trench 518 towards substrate 302 and more specifically, towards doped region barrier 318. In some embodiments, airgap 312 is formed with an etch process having a lateral width of between 1 times edge placement error (EPE) and 3 times EPE, having a lateral width of greater than 2 times EPE, or having a lateral width greater than 3 times EPE. Additionally, airgap 312 can be formed with a depth greater than or equal to the shallow trench isolation depth (STI depth).

Continuing to block 418 "coat the airgap and fill the trench with a dielectric" the sides of airgap 312 with a dielectric 316. FIG. 5J depicts the sides of airgap 312 coated with dielectric 316 and the trench 518 filled with dielectric 316. Said differently, block 418 can correspond to a process step of coating the inner walls of the airgap 312 and filling the trench 518 with dielectric 316. Continuing to block 420 "form top FET structure on substrate" a top structure 304 can be formed on substrate 302. As a specific example, source and drain regions 306 can be formed on each side of dielectric 316 filled trench 518 on a top surface of substrate 302.

FIG. 5K depicts a portion of lattice layer 516 over P area 308 removed, for example, based on a etching process where PR mask 530 covers the lattice layer 516 over the P area 308 and dielectric 316 filled trench 518. FIG. 5L depicts a phosphorus doped silicon (Si:P) portion of source and drain regions 306 grown (e.g., via epitaxial growth, or the like) on the exposed surface (or top surface 528) of substrate 302 over P area 308.

FIG. 5M depicts the other portion of lattice layer 516 over N area 310 removed, for example, based on another etching process where PR mask 532 covers the lattice layer 516 over the N area 310 and dielectric 316 filled trench 518. FIG. 5N depicts a heavily B doped silicon germanium (SiGe:B) portion of source and drain regions 306 grown (e.g., via epitaxial growth, or the like) on the exposed surface (or top surface 528) of substrate 302 over N area 310. Further as depicted, trench 518 is filled with dielectric forming a dielectric barrier between source and drain regions 306.

Method 400 can further comprise block 422 "form multiple layers of FET structure for form a nanosheet device" where process steps for form multiple layers of FET structure on top of the FET device 300 to form a nanosheet device.

FIG. 6 illustrates a semiconductor manufacturing system 600 comprising a controller 602 and semiconductor process tool(s) 604. Controller 602 is communicatively (e.g., electrically or wirelessly) coupled to semiconductor process tool(s) 604 and arranged to receive signals from semiconductor process tool(s) 604 and to communicate control signals to semiconductor process tool(s) 604. One example of semiconductor process tool(s) 604 is VISTA TRIDENT, available from Applied Materials Inc., Santa Clara, CA.

In general, semiconductor process tool(s) 604 operates on target 616 (e.g., to form airgap 312 in substrate 302, or the like). Semiconductor process tool(s) 604 may further include various components (not shown) to support manufacturing of semiconductor devices such as FET device 300, nanosheet device, or the like. Additionally, semiconductor process tool(s) 604 can be multiple tools not housing in a single housing (despite a single tool being depicted in this FIG. 6.

In some embodiments, semiconductor process tool(s) 604 can be controlled by a computing device, such as, controller 602. Controller 602 can be any of a variety of computing devices, such as, a workstation, a laptop, a server, or the like. In some embodiments, controller 602 and Semiconductor process tool(s) 604 are integrated into the same enclosure or housing. In other embodiments, controller 602 and Semiconductor process tool(s) 604 are separate devices. In general, controller 602 is arranged to control the process of manufacturing a semiconductor device, such as, formation of the airgap 312 described herein. The controller 602 may include processor 606, memory 608, control circuitry 610, and input/output devices 618. Processor 606 can be electrically coupled to memory 608 and arranged to execute computer-executable instructions, such as, instructions 612 to facilitate processing target 616 and particularly implanting protons into target 616.

Controller 602 can also include control circuitry 610, such as hardware for monitoring proton implant processing via sensors (not shown) in Semiconductor process tool(s) 604. To facilitate control of the Semiconductor process tool(s) 604 described above, processor 606 may be one of any form of general-purpose computer processor that can be used in an industrial setting, such as a programmable logic controller (PLC), for controlling various chambers and sub-processors, a field-programmable gate-array (FPGA), an application integrated circuit (ASIC), a commercial central processing unit (CPU) having one or more processing cores. Memory 608 can be non-transitory memory and may be one or more of readily available memory such as random access memory (RAM), read only memory (ROM), floppy disk drive, hard disk, solid-state drive, flash memory, or the like. Memory 608 can store instructions 612, which are executable by memory 608 as well as proton implant process parameters 614, which can include information such as the energy and dose for each iteration of a multi-iteration proton implant process as described herein.

The instructions 612 stored in memory 608 are in the form of a program product or a computer-readable storage medium, that can cause circuitry (e.g., processor 606) to implement the methods of the present disclosure when executed. FIG. 7 illustrates computer-readable storage medium 700. Computer-readable storage medium 700 may comprise any non-transitory computer-readable storage medium or machine-readable storage medium, such as an optical, magnetic or semiconductor storage medium. In various embodiments, computer-readable storage medium 700 may comprise an article of manufacture. In some embodiments, computer-readable storage medium 700 may store computer executable instructions 702 with which circuitry (e.g., memory 608, control circuitry 610, or the like) can execute. For example, computer executable instructions 702 can include instructions to implement operations described with respect to method 400 and/or instructions 612. Examples of computer-readable storage medium 700 or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions 702 may include any suitable type of code, such as source code, compiled code, interpreted code, executable code, static code, dynamic code, object-oriented code, visual code, and the like.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the FET device 300, etc. (e.g., as described herein). Data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, programmable logic arrays (PLAs), logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A semiconductor device, comprising:
a semiconductor substrate comprising a positively doped region and a negatively doped region;
an upper device structure formed on a top surface of the semiconductor substrate, the upper device structure comprising a source and a drain separated by a dielectric barrier;
an airgap formed in the semiconductor substrate below the dielectric barrier; and
a barrier between the positively doped region and the negatively doped region in the semiconductor substrate, wherein the barrier is offset from a centerline of the semiconductor substrate.

2. The semiconductor device of claim 1, the airgap having a width greater than a width of the dielectric barrier.

3. The semiconductor device of claim 2, the width greater than or equal to twice an edge placement error of a semiconductor doping process with which the positively doped region and the negatively doped region are formed.

4. The semiconductor device of claim 2, a barrier between the positively doped region and the negatively doped region in the semiconductor substrate offset from the dielectric barrier.

5. The semiconductor device of claim 1, the airgap having a depth greater than or equal to a shallow trench isolation depth of the semiconductor substrate.

6. The semiconductor device of claim 1, wherein the semiconductor substrate comprises silicon.

7. The semiconductor device of claim 1, wherein the upper device structure comprises a phosphorus doped silicon (Si:P) source and a heavily B doped silicon germanium (SiGe:B).

8. The semiconductor device of claim 1, wherein the upper device structure comprises multiple layers of a nanosheet field effect transistor (FET).

9. A method of manufacturing a semiconductor device, comprising:
providing a semiconductor substrate, the semiconductor substrate comprising a positively doped region and a negatively doped region and a lattice layer disposed on a top surface of the semiconductor substrate;
etching the lattice layer to form a trench in the lattice layer exposing the top surface of the semiconductor substrate at a bottom of the trench;
depositing an oxide liner on sidewalls and the bottom of the trench;
etching away the oxide liner on the bottom of the trench;
removing a portion of the semiconductor substrate below the trench to form an airgap in the semiconductor substrate;
coating inner walls of the airgap and filling the trench with a dielectric, wherein the dielectric is formed over the oxide liner on the sidewalls of the trench; and
removing the lattice layer and forming an upper semiconductor device structure on the top surface of the semiconductor substrate.

10. The method of claim 9, comprising:
implanting ions into a first portion of the semiconductor substrate to form the positively doped region; and
implanting ions into a second portion of the semiconductor substrate to form the negatively doped region.

11. The method of claim 10, comprising removing the portion of the semiconductor substrate to form the airgap having a width greater than or equal to twice an edge placement error of a semiconductor doping process with which the positively doped region and the negatively doped region are formed.

12. The method of claim 9, comprising removing the portion of the semiconductor substrate to form the airgap having a width greater than a width of the dielectric.

13. The method of claim 9, comprising removing the portion of the semiconductor substrate to form the airgap having a width greater than or equal to twice an edge placement error of a semiconductor doping process for implanting ions into the positively doped region of the semiconductor substrate and for implanting ions into a the negatively doped region of the semiconductor substrate.

14. The method of claim 9, a barrier between the positively doped region and the negatively doped region in the semiconductor substrate offset from a centerline of the semiconductor substrate.

15. The method of claim 9, the airgap having a depth greater than or equal to a shallow trench isolation depth of the semiconductor substrate.

16. The method of claim 9, wherein the semiconductor substrate comprises silicon.

17. The method of claim 9, wherein the upper semiconductor device structure comprises multiple layers of a nanosheet field effect transistor (FET).

18. The method of claim 9, wherein the upper semiconductor device structure comprises a phosphorus doped silicon (Si:P) source and a heavily B doped silicon germanium (SiGe:B).

19. A semiconductor device, comprising:
a semiconductor substrate comprising a positively doped region and a negatively doped region;
an upper device structure formed on a top surface of the semiconductor substrate, the upper device structure comprising a source and a drain separated by a dielectric barrier; and
an airgap formed in the semiconductor substrate below the dielectric barrier, the airgap having a width greater than or equal to twice an edge placement error of a semiconductor doping process with which the positively doped region and the negatively doped region are formed.

* * * * *